US012660488B2

(12) United States Patent
Jin et al.

(10) Patent No.: US 12,660,488 B2
(45) Date of Patent: Jun. 16, 2026

(54) DISPLAY DEVICE HAVING AN AUXILIARY MARK ON A SUBSTRATE

(71) Applicant: Samsung Display Co., LTD., Yongin-si (KR)

(72) Inventors: Guanghai Jin, Yongin-si (KR); Yongseog Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 391 days.

(21) Appl. No.: 18/355,279

(22) Filed: Jul. 19, 2023

(65) Prior Publication Data

US 2024/0122051 A1     Apr. 11, 2024

(30) Foreign Application Priority Data

Oct. 7, 2022     (KR) ......................... 10-2022-0128764

(51) Int. Cl.
H10K 59/88 (2023.01)
G09G 3/3233 (2016.01)
H10K 59/131 (2023.01)

(52) U.S. Cl.
CPC ........... H10K 59/88 (2023.02); G09G 3/3233 (2013.01); H10K 59/131 (2023.02); *G09G 2300/0819* (2013.01); *G09G 2300/0842* (2013.01)

(58) Field of Classification Search
CPC ...... H10K 59/88; H10K 59/131; H10K 59/12; H10K 59/1213; G09G 3/3233; G09G 2300/0819; G09G 2300/0842
See application file for complete search history.

(56) References Cited

U.S. PATENT DOCUMENTS

| | | | | |
|---|---|---|---|---|
| 4,472,066 | A | * 9/1984 | Murakami | ............... G04G 9/12 968/962 |
| 5,700,601 | A | * 12/1997 | Hasegawa | ................. G03F 1/26 430/323 |
| 8,259,276 | B2 | 9/2012 | Tseng et al. | |
| 2014/0014907 | A1 | 1/2014 | Jin et al. | |
| 2019/0104295 | A1 | 4/2019 | Wendel et al. | |

(Continued)

FOREIGN PATENT DOCUMENTS

| | | |
|---|---|---|
| JP | 1994-045324 A | 2/1994 |
| JP | 2001-168478 A | 6/2001 |

(Continued)

OTHER PUBLICATIONS

Korean Notice of Allowance for KR Application No. 10-2022-0128764, dated Jan. 30, 2026, 6 pages.

*Primary Examiner* — Scott B Geyer
(74) *Attorney, Agent, or Firm* — Womble Bond Dickinson (US) LLP

(57) ABSTRACT

A display device includes a substrate, a plurality of pixels positioned in a display area on the substrate, a plurality of transfer lines configured to transfer signals or voltages to the pixels, the plurality of transfer lines extending in a first direction and being spaced apart from each other in a second direction perpendicular to the first direction, and a plurality of auxiliary patterns in at least one of a plurality of gap spaces defined between ones of the transfer lines adjacent to each other in the second direction, wherein a group of at least two auxiliary patterns of the plurality of auxiliary patterns defines an auxiliary mark on the substrate.

20 Claims, 11 Drawing Sheets

(56)             References Cited

U.S. PATENT DOCUMENTS

2022/0254864 A1*   8/2022   Lee ................... H10K 59/1315
2022/0320253 A1*   10/2022  Cho .................. H10K 59/1315
2023/0217707 A1*   7/2023   Ham ................. H10K 59/1216
                                                      257/40

FOREIGN PATENT DOCUMENTS

KR      10-2014-0010305 A       1/2014
KR      10-2015-0064277 A       6/2015
KR         20160046273 A   *   4/2016   ......... H01L 21/0274
KR      10-2021-0003318 A       1/2021

* cited by examiner

F I G. 3
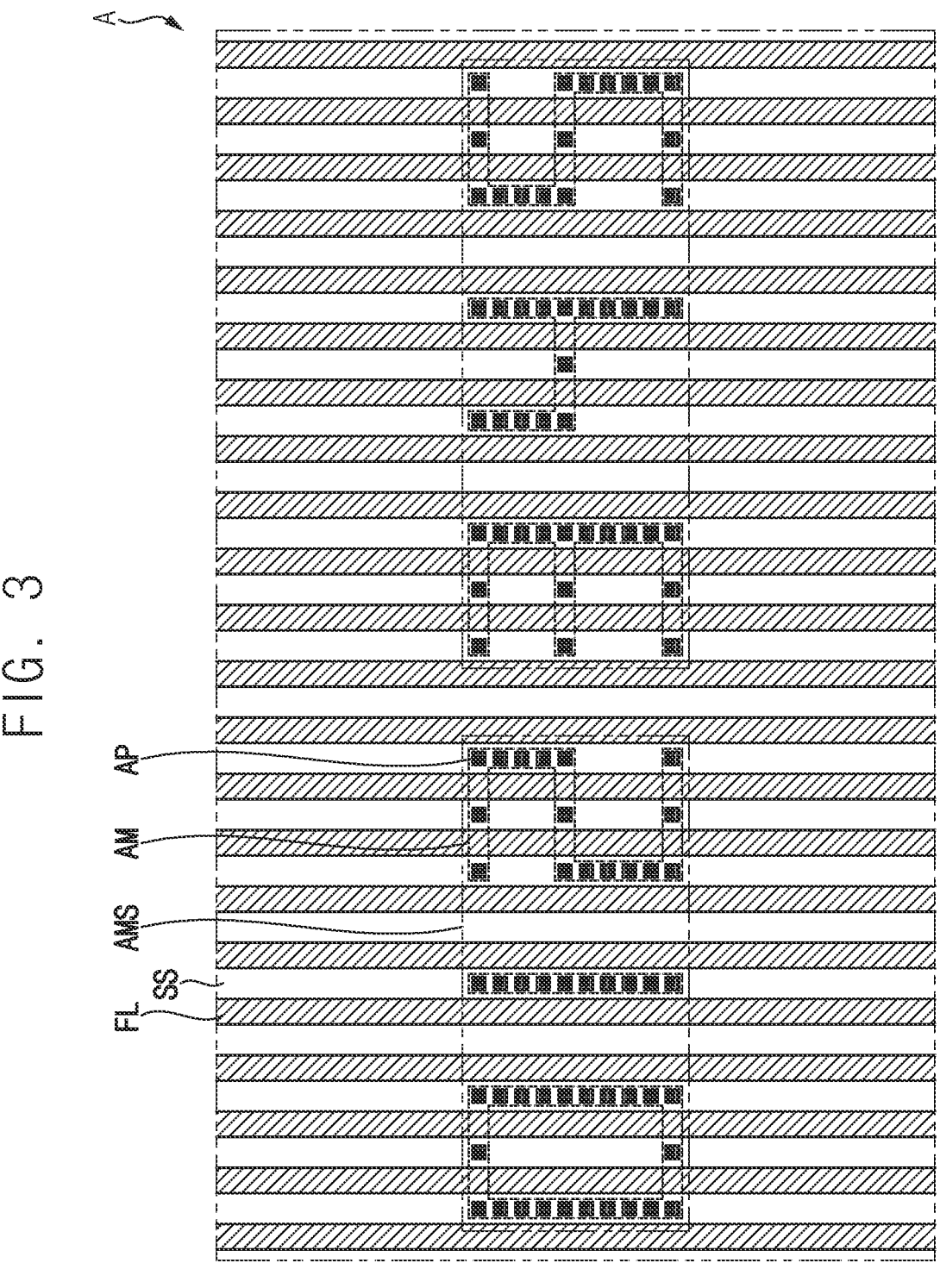

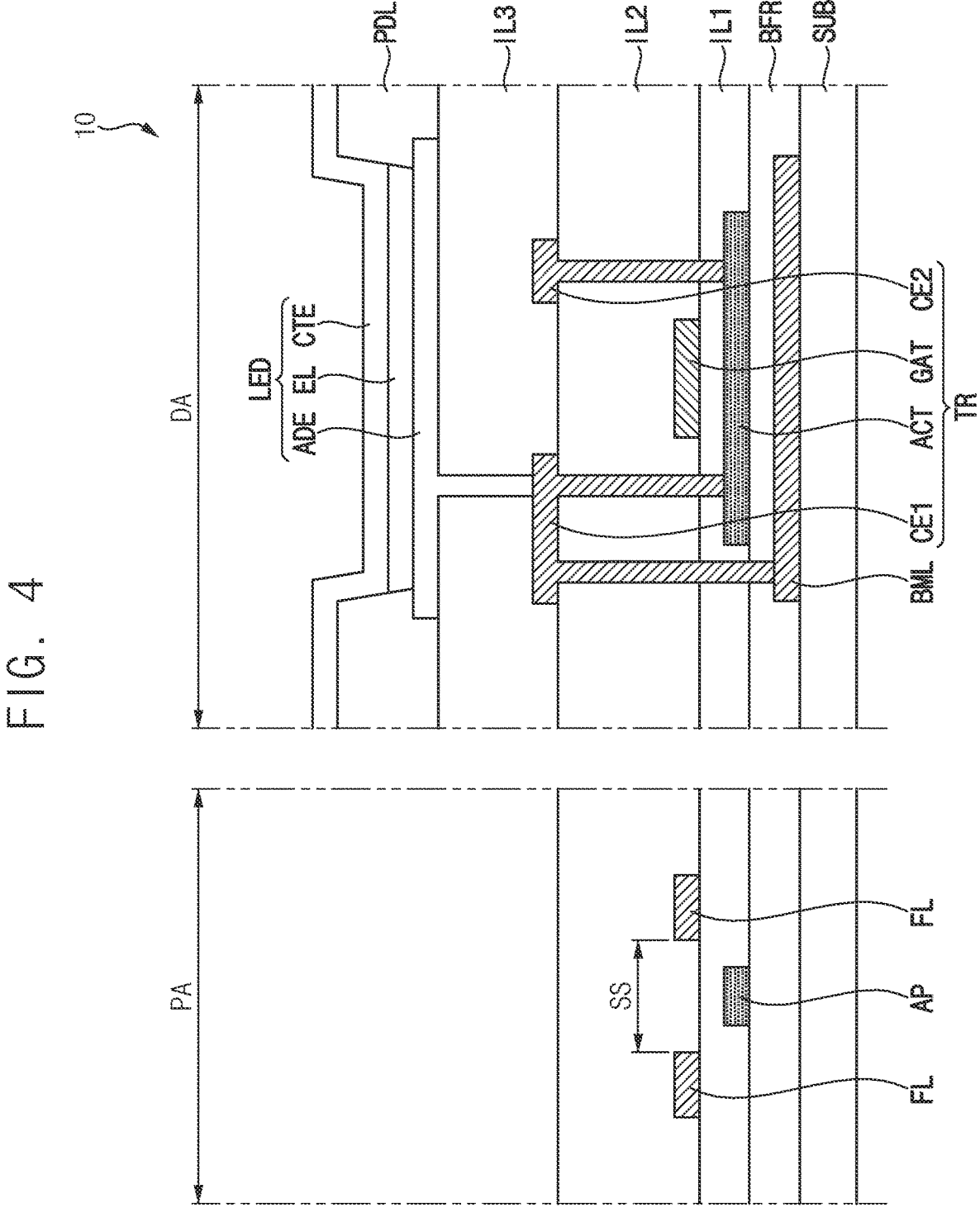
F I G. 4

F I G. 5
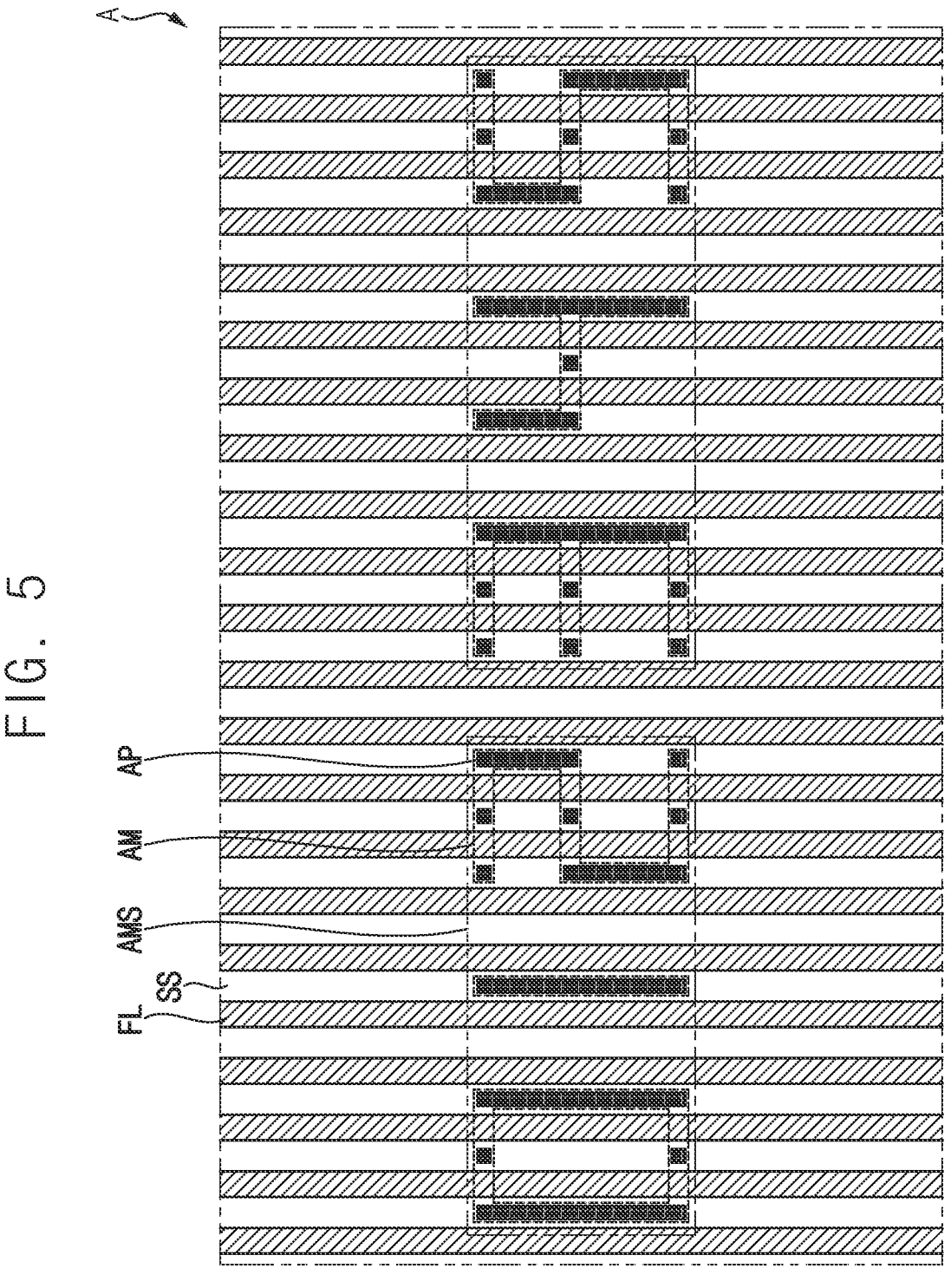

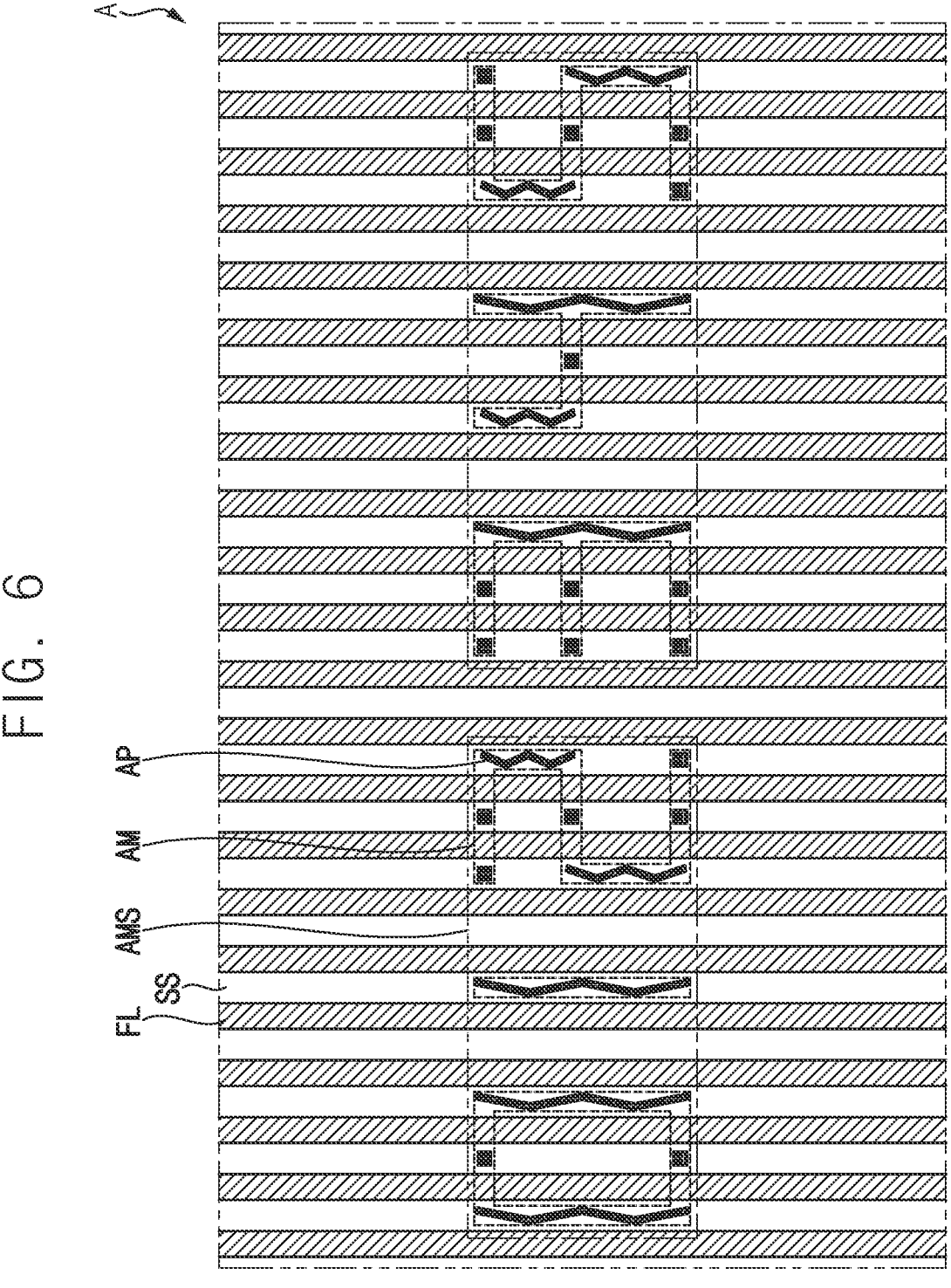
F I G. 6

F I G. 7
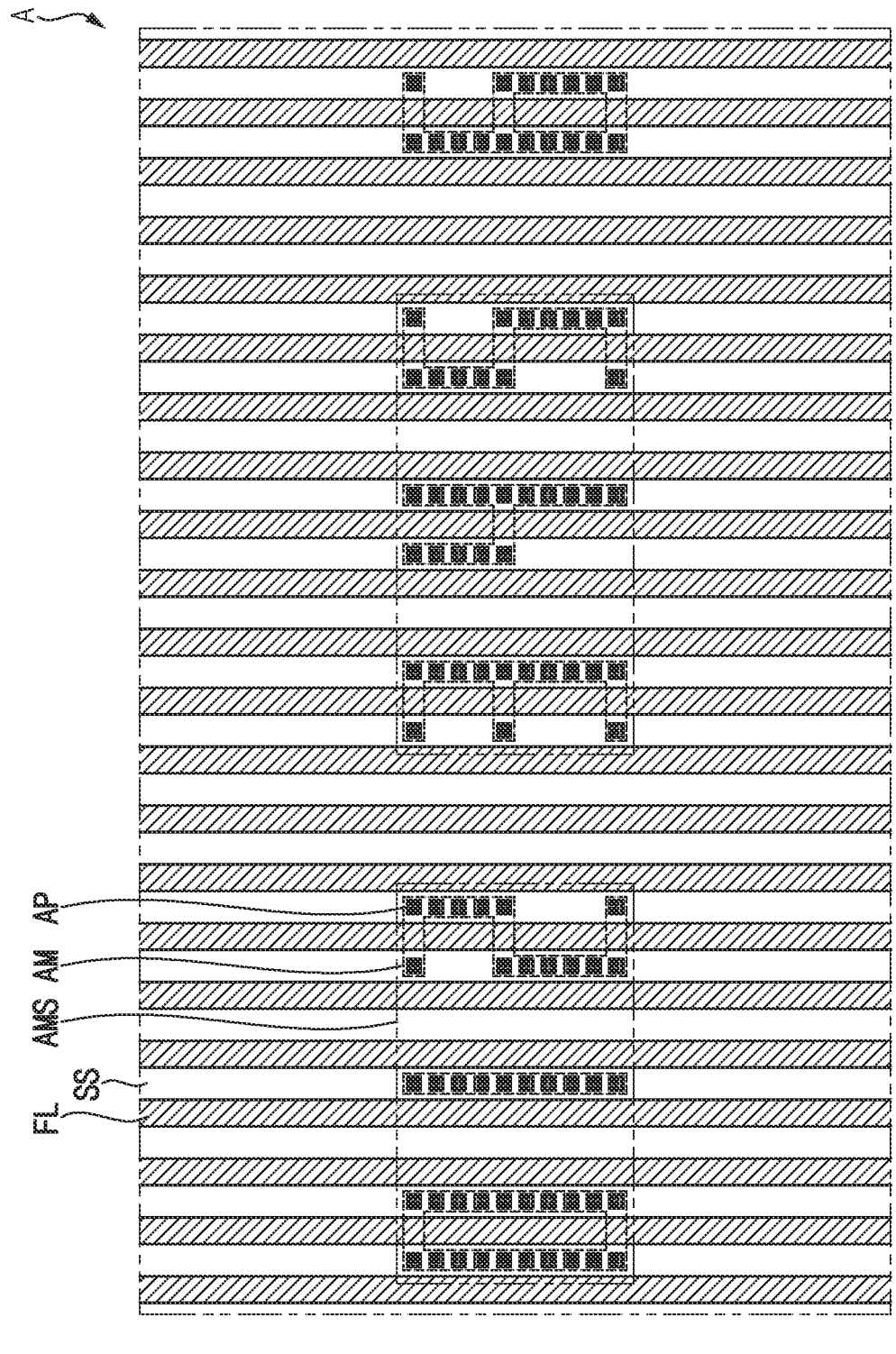

F I G . 8
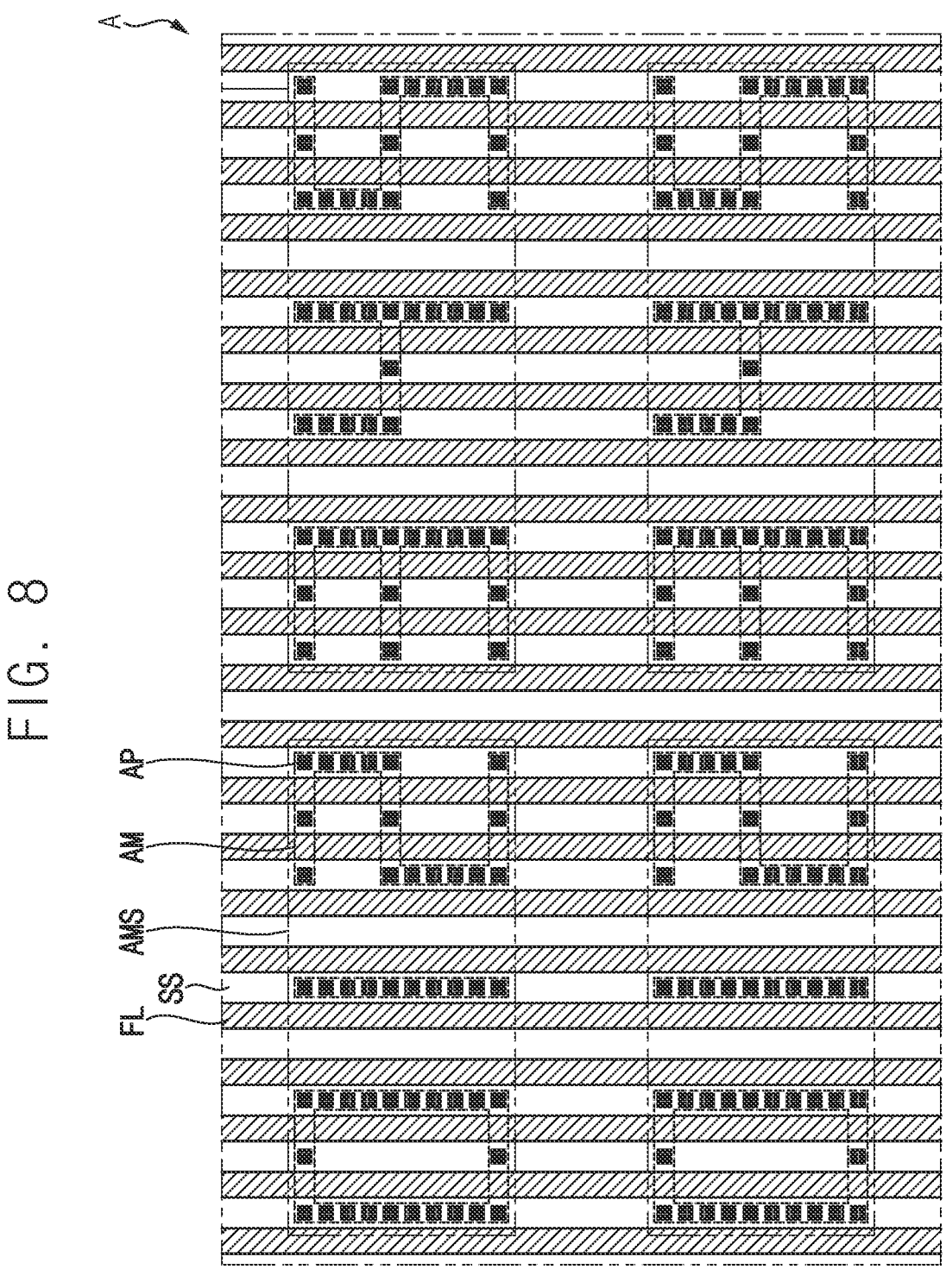

F I G. 9
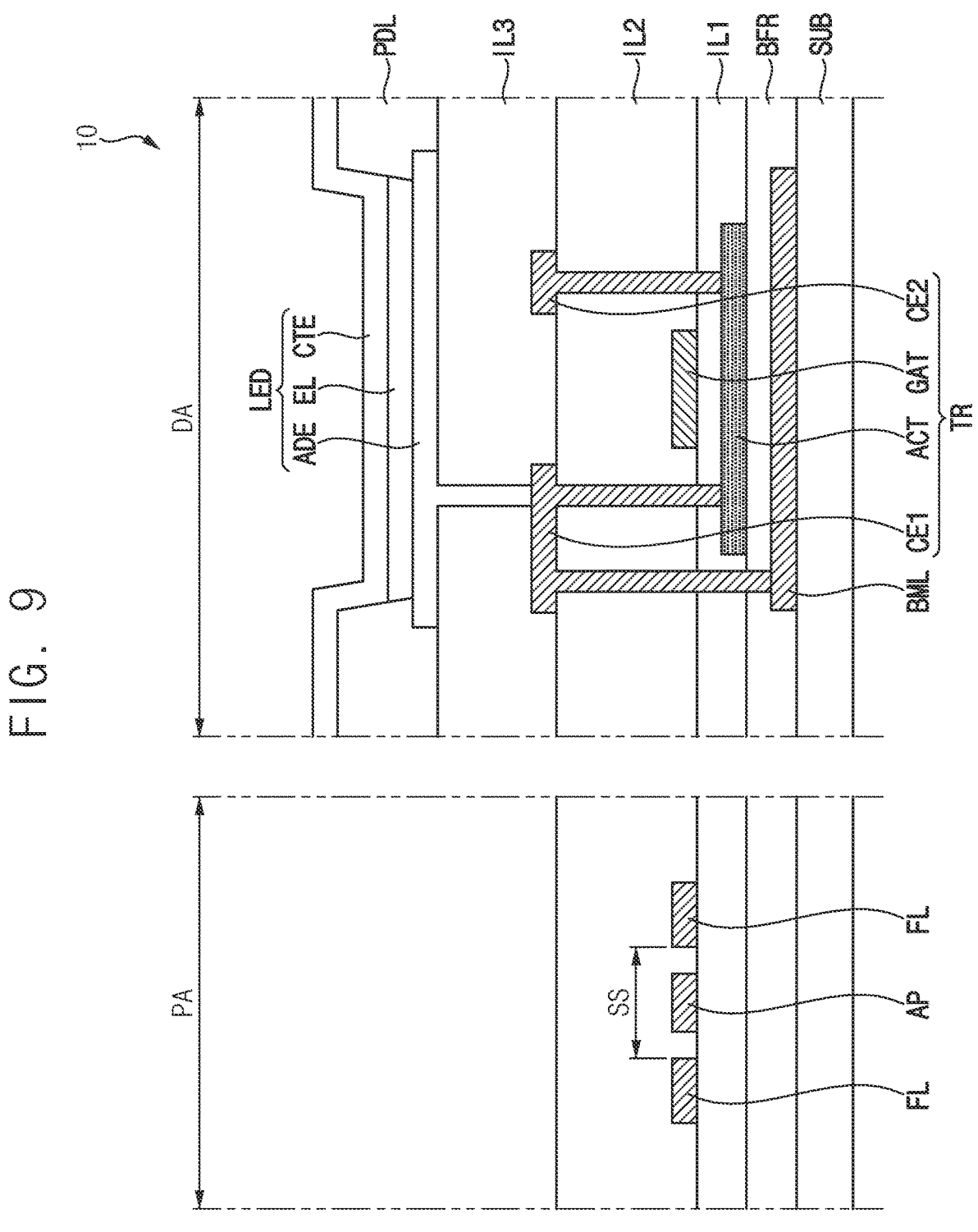

F I G .  1 0
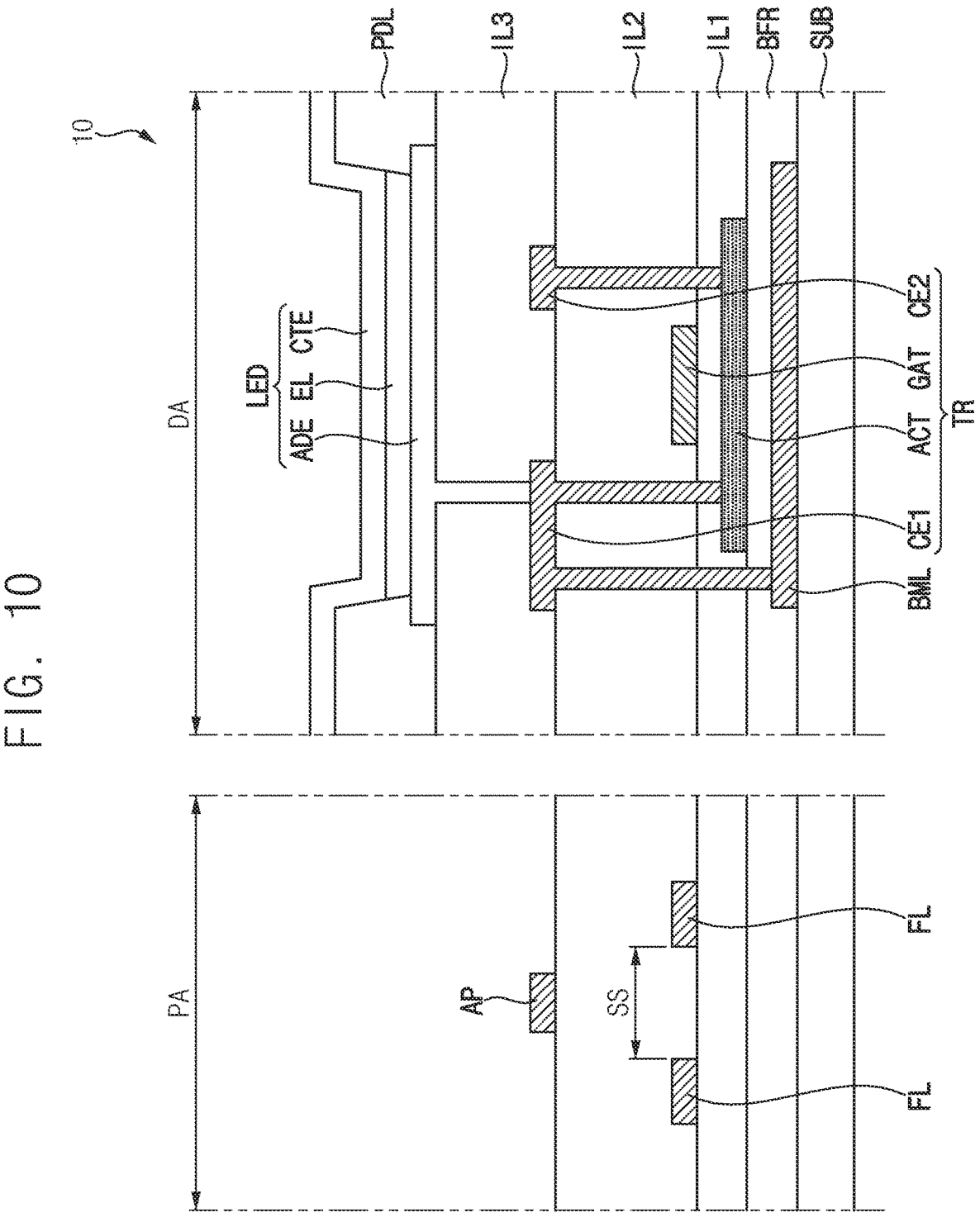

F I G. 1 1

DISPLAY DEVICE HAVING AN AUXILIARY MARK ON A SUBSTRATE

CROSS-REFERENCE TO RELATED APPLICATION(S)

This application claims priority to and the benefit of Korean Patent Application No. 10-2022-0128764, filed on Oct. 7, 2022, in the Korean Intellectual Property Office, the content of which is herein incorporated by reference in its entirety.

BACKGROUND

1. Field

Aspects of embodiments of the present disclosure relate to a display device.

2. Description of the Related Art

A display device includes pixels, a driver, and lines for driving the pixels. It may be desired to identify a location and/or an order of the lines in order to check for defect that may occur in the manufacturing process of the display device or to perform repairs.

SUMMARY

Aspects of embodiments are directed to a display device with improved manufacturing process efficiency and display quality.

According to some embodiments, there is provided a display device including: a substrate; a plurality of pixels positioned in a display area on the substrate; a plurality of transfer lines configured to transfer signals or voltages to the pixels, the plurality of transfer lines extending in a first direction and being spaced apart from each other in a second direction perpendicular to the first direction; and a plurality of auxiliary patterns in at least one of a plurality of gap spaces defined between ones of the transfer lines adjacent to each other in the second direction, wherein a group of at least two auxiliary patterns of the plurality of auxiliary patterns defines an auxiliary mark on the substrate.

In some embodiments, the group of at least two auxiliary patterns defining the auxiliary mark is positioned in three of the gap spaces sequentially arranged in the second direction.

In some embodiments, the group of at least two auxiliary patterns defining the auxiliary mark is positioned in two of the gap spaces sequentially arranged in the second direction.

In some embodiments, a planar shape of the auxiliary mark is a number shape, a character shape, a symbol shape, and a special shape having an arbitrary shape according to a rule.

In some embodiments, at least one of the auxiliary patterns has a dot shape in a plan view.

In some embodiments, at least one of the auxiliary patterns extends in the first direction and has a bar shape parallel to the transfer lines.

In some embodiments, at least one of the auxiliary patterns extends in the first direction and has a bar shape with at least one bent or discontinuous portion.

In some embodiments, the display device further includes: an active pattern positioned in the display area on the substrate; a gate electrode on the active pattern; and a first connection electrode and a second connection electrode on the gate electrode, wherein each of the auxiliary patterns includes a same material as the active pattern.

In some embodiments, the display device further includes: an active pattern positioned in the display area on the substrate; a gate electrode on the active pattern; and a first connection electrode and a second connection electrode on the gate electrode, wherein each of the auxiliary patterns includes a same material as the gate electrode.

In some embodiments, the display device further includes: an active pattern positioned in the display area on the substrate; a gate electrode on the active pattern; and a first connection electrode and a second connection electrode on the gate electrode, wherein each of the auxiliary patterns includes a same material as the first connection electrode and the second connection electrode.

In some embodiments, a plurality of auxiliary marks including the auxiliary mark is arranged along the second direction in a plan view.

In some embodiments, at least one gap space of the gap spaces is located between ones of the auxiliary marks adjacent to each other in the second direction.

In some embodiments, the plurality of auxiliary marks define, on the substrate, a plurality of auxiliary mark sets in which two or more auxiliary marks that are sequentially arranged in the second direction are grouped.

In some embodiments, the auxiliary mark sets are arranged along the second direction in a plan view.

In some embodiments, at least one gap space of the gap spaces is located between ones of the auxiliary mark sets adjacent to each other in the second direction.

In some embodiments, the auxiliary marks are arranged along the first direction and the second direction in a plan view.

In some embodiments, the auxiliary marks sets are arranged along the first direction and the second direction in a plan view.

In some embodiments, the auxiliary patterns are spaced apart from the transfer lines in a plan view.

In some embodiments, a width of each of the gap spaces in the second direction is 7.5 µm or less.

In some embodiments, a width of each of the auxiliary patterns in the second direction is 3.5 µm or less.

The display device according to some embodiments includes the auxiliary patterns disposed in at least one of the spaced spaces (e.g., gaps, gap spaces, or wire gaps) defined between the transfer lines. Also, the auxiliary marks may be defined by grouping at least two or more of the auxiliary patterns to provide various pieces of information related to the transfer lines. Accordingly, since the auxiliary marks can be defined by grouping the auxiliary patterns even when the distance between the transfer lines is small, the auxiliary marks may be easily formed. Thus, an efficiency of the manufacturing process of the display device may be improved (e.g., increased). In addition, a dead space of the display device generated in a process of forming the auxiliary marks may be reduced. Accordingly, a display quality of the display device may be improved (e.g., increased).

It is to be understood that both the foregoing general description and the following detailed description are exemplary and explanatory and are intended to provide further explanation of the present disclosure, the scope of which is defined by claims and equivalents thereof.

BRIEF DESCRIPTION OF THE DRAWINGS

Illustrative, non-limiting embodiments will be more clearly understood from the following detailed description taken in conjunction with the accompanying drawings.

3

Figure 1:
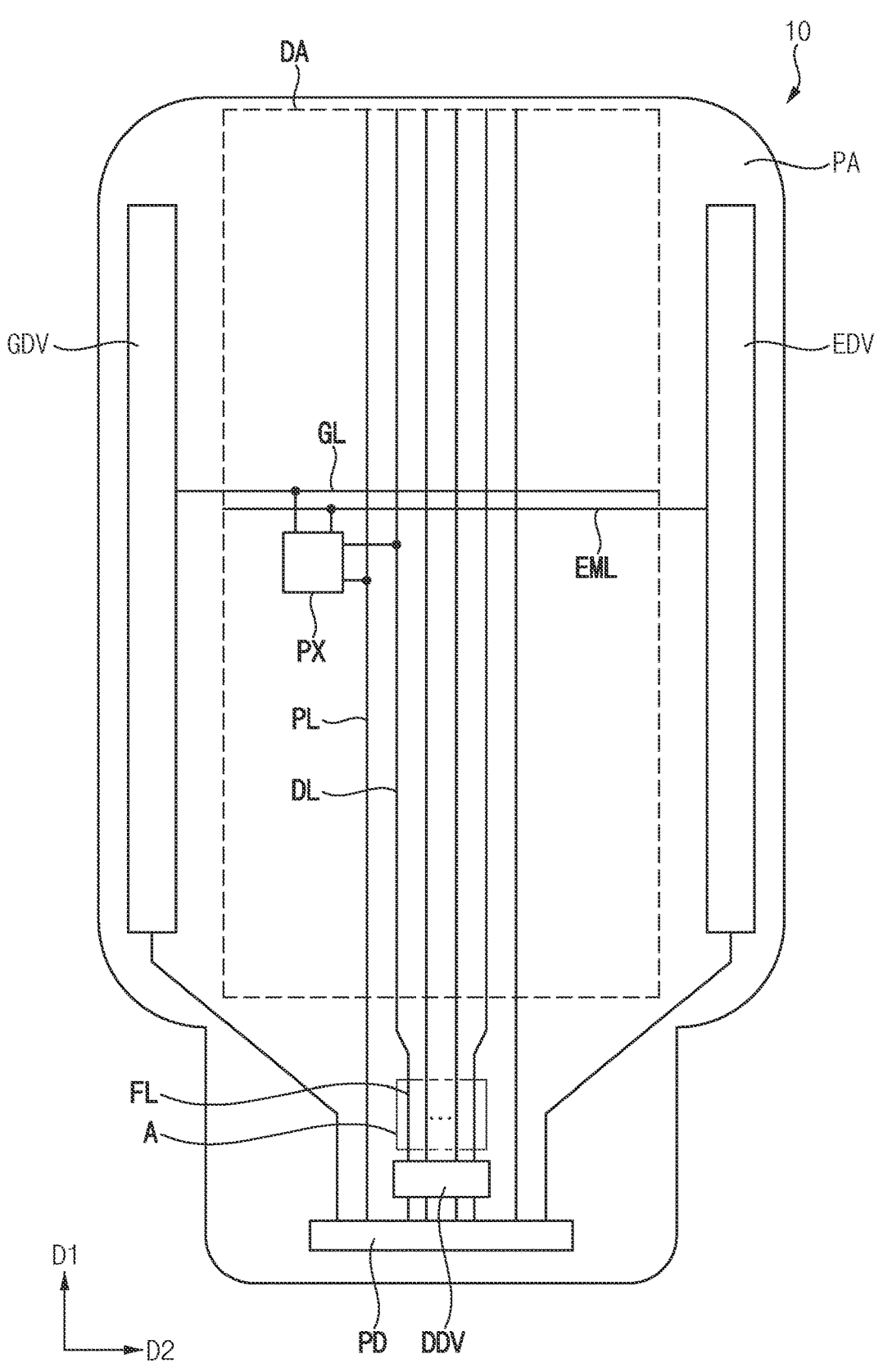

FIG. 1 is a plan view illustrating a display device according to some embodiments of the present disclosure.

Figure 2:
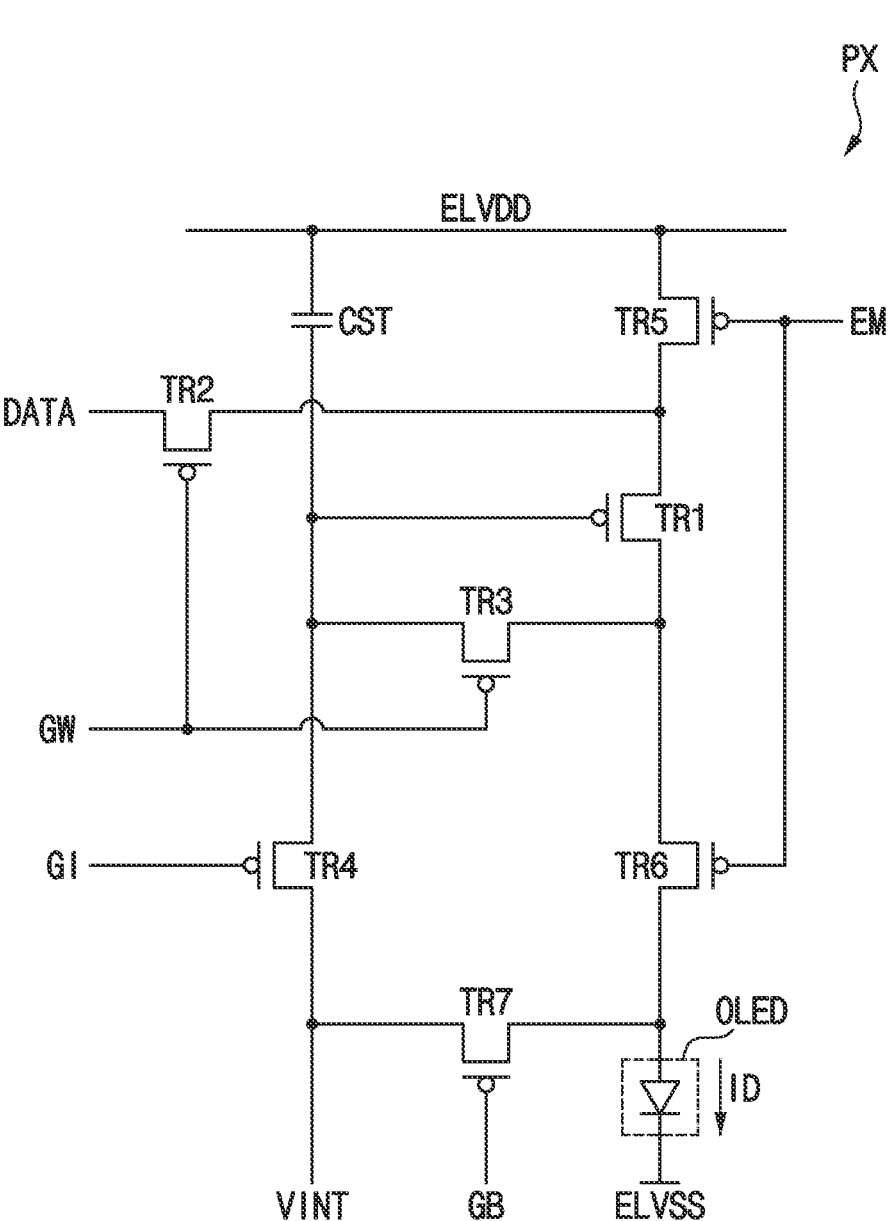

FIG. 2 is a circuit diagram illustrating a pixel included in the display device of FIG. 1.

FIG. 3 is an enlarged view illustrating the enlarged area 'A' of FIG. 1.

FIG. 4 is a cross-sectional view illustrating a display device of FIG. 1, according to some embodiments of the present disclosure.

FIGS. 5 to 11 are views illustrating display devices according to some embodiments of the present disclosure.

DETAILED DESCRIPTION

The invention will now be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the present disclosure to those skilled in the art. Like reference numerals refer to like elements throughout.

FIG. 1 is a plan view illustrating a display device according to some embodiments of the present disclosure.

Referring to FIG. 1, the display device 10 may be divided into a display area DA and a peripheral area PA. In some embodiments, the peripheral area PA is located around the display area DA. For example, the peripheral area PA may surround the display area DA.

In some embodiments, the display device 10 has a substantially rectangular shape in a plan view. For example, the display device 10 may have a rectangular shape with rounded corners in a plan view. However, the present disclosure is not necessarily limited thereto, and the display device 10 may have various suitable shapes in a plan view. For example, the display device 10 may have a rectangular shape with vertical corners in a plan view.

At least one pixel PX may be disposed in the display area DA, and an image may be displayed through the pixel PX in the display area DA. The pixel PX may include a driving device (e.g., a transistor) and a light emitting device (e.g., an organic light emitting diode) connected to the driving device. The light emitting device may emit light by receiving a signal and/or a voltage from the driving device. For example, the driving device may provide a driving current to the light emitting device, and the light emitting device may generate light having a luminance corresponding to the driving current. The pixel PX may be generally disposed in the display area DA. For example, the pixel PX may be arranged in a matrix form in the display area DA.

A driver for driving the pixel PX may be disposed in the peripheral area PA. For example, the driver may include a gate driver GDV, a data driver DDV, a emission driver EDV, and a pad part PD. The driver may provide the signal and/or the voltage to the pixel PX.

The display device 10 may include at least one selected from a data line DL, a gate line GL, an emission control line EML, a driving voltage line PL, and a transfer line FL which transfer the signal and/or the voltage to the pixel PX. In some embodiments, the transfer lines FL are disposed in the peripheral area PA. In some embodiments, the transfer lines FL are electrically connected to the data driver DDV and the data lines DL. In other words, the transfer lines FL may receive a data voltage from the data driver DDV and provide the data voltage to the data lines DL. In some examples, the transfer lines FL may be fan-out lines electrically connecting the data driver DDV and the data lines DL. However, the present disclosure is not necessarily limited thereto, and the transfer lines FL may include various lines such as a power transfer line for providing a power supply voltage to the light emitting device disposed in the display area DA.

FIG. 2 is a circuit diagram illustrating a pixel included in the display device of FIG. 1.

Referring to FIGS. 1 and 2, the pixel PX may include a first transistor TR1, a second transistor TR2, a third transistor TR3, a fourth transistor TR4, a fifth transistor TR5, a sixth transistor TR6, a seventh transistor TR7, a storage capacitor CST, and an organic light emitting diode OLED.

The first transistor TR1 may include a gate terminal, a first terminal, and a second terminal. The gate terminal may be connected to the storage capacitor CST. The first terminal may be connected to the second transistor TR2. The second terminal may be connected to the sixth transistor TR6. The first transistor TR1 may generate a driving current ID based on a voltage difference between the gate terminal and the first terminal.

The second transistor TR2 may include a gate terminal, a first terminal, and a second terminal. The gate terminal may receive a first gate signal GW. The first terminal may receive a data voltage DATA. The second terminal may be connected to the first transistor TR1. The second transistor TR2 may transfer the data voltage DATA to the first transistor TR1 in response to the first gate signal GW.

The third transistor TR3 may include a gate terminal, a first terminal, and a second terminal. The gate terminal may receive the first gate signal GW. The first terminal may be connected to the gate terminal of the first transistor TR1. The second terminal may be connected to the second terminal of the first transistor TR1. The third transistor TR3 may compensate for a threshold voltage of the first transistor TR1.

The fourth transistor TR4 may include a gate terminal, a first terminal, and a second terminal. The gate terminal may receive a second gate signal GI. The first terminal may be connected to the gate terminal of the first transistor TR1. The second terminal may receive an initialization voltage VINT. The fourth transistor TR4 may initialize the gate terminal of the first transistor TR1.

The fifth transistor TR5 may include a gate terminal, a first terminal, and a second terminal. The gate terminal may receive an emission control signal EM. The first terminal may receive a high power supply voltage ELVDD. The second terminal may be connected to the first transistor TR1. The fifth transistor TR5 may provide the high power supply voltage ELVDD to the first transistor TR1 in response to the emission control signal EM.

The sixth transistor TR6 may include a gate terminal, a first terminal, and a second terminal. The gate terminal may receive the emission control signal EM. The first terminal may be connected to the first transistor TR1. The second terminal may be connected to the organic light emitting diode OLED. The sixth transistor TR6 may transfer the driving current ID to the organic light emitting diode OLED in response to the emission control signal EM.

The seventh transistor TR7 may include a gate terminal, a first terminal, and a second terminal. The gate terminal may receive a third gate signal GB. The first terminal may be connected to the organic light emitting diode OLED. The second terminal may receive the initialization voltage VINT. The seventh transistor TR7 may initialize the organic light emitting diode OLED.

The storage capacitor CST may include a first terminal and a second terminal. The first terminal may receive the high power supply voltage ELVDD. The second terminal may be connected to the gate terminal of the first transistor TR1. The storage capacitor CST may maintain a voltage level of the gate terminal of the first transistor TR1 during an inactive period of the first gate signal GW.

The organic light emitting diode OLED may include a first terminal and a second terminal. The first terminal may be connected to the sixth transistor TR6. The second terminal may receive a low power supply voltage ELVSS. The organic light emitting diode OLED may emit light based on the driving current ID.

A circuit connection structure of the pixel PX shown in FIG. 2 is only an example and may be variously changed. For example, when the circuit of the pixel PX does not include the third to seventh transistors TR3, TR4, TR5, TR6, and TR7, the connection structure between components in the circuit of the pixel PX may be changed to form a connection structure between components included in the circuit of the pixel PX (e.g., the first transistor TR1, the second transistor TR2, the storage capacitor CST, and the organic light emitting diode OLED).

FIG. 3 is an enlarged view illustrating an enlarged area 'A' of FIG. 1.

Referring to FIGS. 1 and 3, each of the transfer lines FL may extend in a first direction D1 and may be spaced apart from each other in a second direction D2 perpendicular to the first direction D1. Accordingly, spaced spaces (e.g., gaps, gap spaces, or wire gaps) SS may be defined between transfer wires FL that are adjacent to each other (e.g., are nearest to one another) in the second direction D2. In other words, the spaced spaces SS may refer to spaces between the transfer lines FL that are adjacent to each other. In the peripheral area PA of the display device 10, the transfer lines FL and the spaced spaces SS may be alternately arranged in the second direction D2.

In some embodiments, a width of each of the spaced spaces SS in the second direction D2 is about 0.1 μm to about 7.5 μm, and in some examples about 0.1 μm to about 5.0 μm. In other words, a distance between the transfer lines FL that are adjacent to each other in the second direction D2 may be about 0.1 μm to about 7.5 μm, and in some examples, about 0.1 μm to about 5.0 μm. When the width of each of the spaced spaces SS in the second direction D2 satisfies the above range, generation of parasitic capacitance between transfer lines FL may be reduced or prevented. Also, a display quality of the display device may not deteriorate.

In some embodiments, the display device 10 further includes a plurality of auxiliary patterns AP. The auxiliary patterns AP may be disposed in the spaced spaces SS. In other words, the auxiliary patterns AP may be disposed between the transfer lines FL that are adjacent to each other in the second direction D2.

In some embodiments, each of the auxiliary patterns AP has a dot shape in a plan view. However, the present disclosure is not necessarily limited thereto, and each of the auxiliary patterns AP may have various suitable shapes in a plan view. This will be described later in more detail with reference to FIGS. 5 and 6.

In some embodiments, a width of each of the auxiliary patterns AP in the second direction D2 are smaller than the width of each of the spaced spaces SS in the second direction D2. In other words, in a plan view, the transfer lines FL and the auxiliary patterns AP may be spaced apart from each other. For example, the width of each of the auxiliary patterns AP in the second direction D2 may be about 0.05 μm to about 3.5 μm, and in some examples about 0.05 μm to about 2.5 μm. When the width of each of the auxiliary patterns AP in the second direction D2 satisfies the above range, an identification of the auxiliary patterns AP may not be decreased, and generation of parasitic capacitance between the auxiliary patterns AP and the transfer lines FL may be reduced or prevented.

In the peripheral area PA, at least two or more of the auxiliary patterns AP may be grouped to define a plurality of auxiliary marks AM. Each of the auxiliary marks AM may provide various pieces of information related to the transfer lines FL. In other words, by identifying the auxiliary marks AM, various pieces of information related to the transfer lines FL may be identified. For example, each of the auxiliary marks AM may provide information about a location and/or an order of the transfer lines FL. In other words, each of the auxiliary marks AM may function as an identification mark for recognizing various pieces of information related to the transfer lines FL.

The auxiliary marks AM may be defined (e.g., produced) by grouping the auxiliary patterns AP according to a set or predetermined rule or arrangement. For example, as shown in FIG. 3, the auxiliary marks AM may be defined by grouping the auxiliary patterns AP to have a number shape (e.g., CO', '1', '2', '3', '4', '5' in FIG. 3) in a plan view.

However, the present disclosure is not necessarily limited thereto, and when information related to the transfer lines FL can be displayed, the auxiliary patterns AP may be grouped so that each of the auxiliary marks AM have various planar shapes. For example, in a plan view, each of the auxiliary marks AM may have a number shape of '6', '7', '8', and '9'.

In addition, a planar shape of each of the auxiliary marks AM may also be a character shape, a symbol shape, or a special shape having an arbitrary shape according to a set or predetermined rule or arrangement. In other words, the auxiliary patterns AP may be grouped so that each of the auxiliary marks AM has a character shape, a symbol shape, or a special shape having an arbitrary shape according to a set or predetermined rule or arrangement.

In addition, each of the auxiliary marks AM does not necessarily have the same planar shape type, and a planar shape of each of the auxiliary marks AM may be a combination of two or more of a number shape, a character shape, a symbol shape, and a special shape having an arbitrary shape according to a set or predetermined rule or arrangement.

In some embodiments, the auxiliary patterns AP defining at least one of the auxiliary marks AM is disposed in the three adjacent spaces (e.g., gaps, gap spaces, or wire gaps) SS sequentially arranged in the second direction D2. For example, as shown in FIG. 3, each of the auxiliary marks AM having a number shape such as '0', '1', '2', '3', '4', and '5' may be defined by grouping the auxiliary patterns AP disposed in the three spaced spaces SS sequentially arranged in the second direction D2.

However, the present disclosure is not necessarily limited thereto, and when information related to transfer lines FL can be displayed, an arrangement relationship of the auxiliary patterns AP defining one auxiliary mark AM may be determined in various ways. This will be described later in more detail with reference to FIG. 7. In some embodiments, in a plan view, the auxiliary marks AM are arranged along the second direction D2. In this case, at least one spaced space SS may be located between the auxiliary marks AM that are adjacent to each other (e.g., nearest one another) in the second direction D2. For example, as shown in FIG. 3, the auxiliary marks AM that are adjacent to each other in the second direction D2 may be spaced apart from each other (e.g., offset/separated from one another) by one spaced space SS. Accordingly, generation of parasitic capacitance between the auxiliary marks AM may be reduced or prevented.

In some embodiments, two or more auxiliary marks AM sequentially arranged in the second direction D2 are grouped in the peripheral area PA to define a plurality of auxiliary mark sets AMS. For example, as shown in FIG. 3, three auxiliary marks AM sequentially arranged in the second direction D2 may be grouped to define (e.g., partially define or define one constituent line/row of) one auxiliary mark set AMS. However, the present disclosure is not necessarily limited thereto, and in other embodiments, four or more auxiliary marks AM sequentially arranged in the second direction D2 may be grouped to define (e.g., partially define or define one constituent line/row of) one auxiliary mark set AMS.

The auxiliary mark set AMS may provide various pieces of information related to the transfer lines FL. In other words, by identifying the auxiliary mark set AMS, various pieces of information related to the transfer lines FL may be identified. For example, each of the auxiliary mark sets AMS may provide information about a location and/or an order of the transfer lines FL. In other words, each of the auxiliary mark sets AMS may function as an identification mark set for recognizing various pieces of information related to the transfer lines FL.

In some embodiments, in a plan view, the auxiliary mark sets AMS are arranged along the second direction D2. In this case, at least one spaced space SS may be located between the auxiliary mark sets AMS that are adjacent to each other (e.g., nearest one another) in the second direction D2. For example, as shown in FIG. 3, the auxiliary mark sets AMS that are adjacent to each other in the second direction D2 may be spaced apart from each other by one spaced space SS. Accordingly, generation of parasitic capacitance between the auxiliary mark sets AMS may be reduced or prevented.

FIG. 4 is a cross-sectional view illustrating a display device of FIG. 1. For example, FIG. 4 may be a cross-sectional view illustrating the peripheral area PA and the display area DA of the display device of FIG. 1 according to some embodiments of the present disclosure.

Referring to FIG. 4, the display device 10 may include a substrate SUB, a back metal layer BML, a buffer layer BFR, an active pattern ACT, the auxiliary pattern AP, a first insulating layer IL1, a gate electrode GAT, the transfer lines FL, a second insulating layer IL2, a first connection electrode CE1, a second connection electrode CE2, a third insulating layer IL3, an anode electrode ADE, an emission layer EL, a cathode electrode CTE, and a pixel defining layer PDL.

The active pattern ACT, the gate electrode GAT, the first connection electrode CE1 and the second connection electrode CE2 may form a transistor TR. For example, the transistor TR may correspond to any one of the first transistor TR1, the second transistor TR2, the third transistor TR3, the third transistor TR4, and the fifth transistor TR5, the sixth transistor TR6, and the seventh transistor TR7 described above with reference to FIG. 2.

The anode electrode ADE, the emission layer EL, and the cathode electrode CTE may form the light emitting device LED. For example, the light emitting device LED may correspond to the organic light emitting diode OLED described with reference to FIG. 2.

The substrate SUB may include a transparent material or an opaque material. According to some examples, materials that can be used as the substrate SUB may include glass, quartz, plastic, or the like. These may be used alone or in combination with each other. In addition, the substrate SUB may be composed of a single layer or multiple layers in combination with each other.

The back metal layer BML may be disposed on the substrate SUB. In some embodiments, the back metal layer BML is formed of a metal, an alloy, a conductive metal oxide, a transparent conductive material, and/or the like. Examples of materials that can be used as the back metal layer BML may include silver (Ag), an alloy containing silver, molybdenum (Mo), an alloy containing molybdenum, aluminum (Al), an alloy containing aluminum, and aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium-tin oxide (ITO), indium-zinc oxide (IZO), and/or the like. These may be used alone or in combination with each other. Also, the back metal layer BML may be formed as a single layer or as multiple layers.

In some embodiments, the back metal layer BML is connected to the transistor TR and is under the transistor TR. Also, the back metal layer BML may be electrically connected to the anode electrode ADE. The back metal layer BML may transfer externally-applied signals to driving devices and/or light emitting devices.

The buffer layer BFR may be disposed on the substrate SUB and may cover the back metal layer BML. In some embodiments, the buffer layer BFR is entirely disposed in the display area DA and the peripheral area PA. The buffer layer BFR may include an inorganic insulating material.

The active pattern ACT may be disposed in the display area DA on the buffer layer BFR. In some embodiments, the active pattern ACT includes an oxide semiconductor, a silicon semiconductor, an organic semiconductor, and/or the like. For example, the oxide semiconductor may include oxidation material including indium (In), gallium (Ga), tin (Sn), zirconium (Zr), vanadium (V), hafnium (Hf), cadmium (Cd), germanium (Ge), chromium (Cr), titanium (Ti), zinc (Zn), and/or the like. The silicon semiconductor may include amorphous silicon, polycrystalline silicon, and/or the like. These may be used alone or in combination with each other.

The auxiliary pattern AP may be disposed in the peripheral area PA on the buffer layer BFR. The auxiliary pattern AP may be the same as the auxiliary pattern AP described with reference to FIG. 3.

In some embodiments, the auxiliary pattern AP is formed together with the active pattern ACT. In other words, the auxiliary pattern AP may be disposed on the same layer as the active pattern ACT. In other words, the auxiliary pattern AP may include the same or substantially the same material as the active pattern ACT. For example, the auxiliary pattern AP may include the oxide semiconductor, the silicon semiconductor, the organic semiconductor, or the like.

The first insulating layer IL1 may be disposed on the buffer layer BFR and may cover the active pattern ACT and the auxiliary pattern AP. In some embodiments, the first insulating layer IL1 is entirely disposed in the display area DA and the peripheral area PA on the buffer layer BFR. The first insulating layer IL1 may include an inorganic insulating material.

The gate electrode GAT may be disposed in the display area DA on the first insulating layer IL1. The gate electrode GAT may include a metal, an alloy, a conductive metal nitride, a conductive metal oxide, a transparent conductive material, and/or the like. Examples of the conductive material that can be used as the gate electrode GAT may include gold (Au), silver (Ag), aluminum (Al), platinum (Pt), nickel (Ni), titanium (Ti), and palladium (Pd).), Magnesium (Mg), Calcium (Ca), Lithium (Li), Chromium (Cr), Tantalum (Ta), Tungsten (W), Copper (Cu), Molybdenum (Mo), Scandium (Sc), Neodymium (Nd), iridium (Ir), alloys containing aluminum, alloys containing silver, alloys containing copper, alloys containing copper, alloys containing molybdenum, aluminum nitride (AlN), tungsten nitride (WN), titanium nitride (TiN), chromium nitride (CrN), tantalum nitride (TaN), strontium ruthenium oxide (SrRuO), zinc oxide (ZnO), indium tin oxide (ITO), tin oxide (SnO), indium oxide (InO), gallium oxide (GaO), indium zinc oxide (IZO), or the like. These may be used alone or in combination with each other. The gate electrode GAT may have a single-layer structure or a multi-layer structure including a plurality of conductive layers.

The transfer lines FL may be disposed in the peripheral area PA on the first insulating layer IL1. The transfer lines FL may be the same as the transfer lines FL described with reference to FIG. 3.

In some embodiments, the transfer lines FL are formed together with the gate electrode GAT. In other words, the transfer lines FL may be disposed on the same layer as the gate electrode GAT. The transfer lines FL may include the same material as the gate electrode GAT. For example, the transfer lines FL may include a metal, an alloy, a conductive metal nitride, a conductive metal oxide, a transparent conductive material, and/or the like. However, the present invention is not necessarily limited thereto, and the transfer lines FL may be formed together with at least one of various conductive layers forming the transistor TR and the light emitting device LED disposed in the display area DA.

In some embodiments, the spaced space SS are defined between the adjacent transfer lines FL in the peripheral area PA and the auxiliary pattern AP may be disposed in the spaced space SS. In other words, the auxiliary pattern AP may be disposed between transfer lines FL that are adjacent to each other.

The second insulating layer IL2 may be disposed on the first insulating layer IL1 and may cover the gate electrode GAT and the transfer lines FL. In some embodiments, the second insulating layer IL2 is entirely disposed in the display area DA and the peripheral area PA on the first insulating layer IL1. The second insulating layer IL2 may include an inorganic insulating material.

The first connection electrode CE1 and the second connection electrode CE2 may be disposed on the second insulating layer IL2. Each of the first connection electrode CE1 and the second connection electrode CE2 may contact the active pattern ACT through a corresponding contact hole. Based on a signal applied to the gate electrode GAT, the first connection electrode CE1 and the second connection electrode CE2 may be electrically connected.

In some embodiments, the first connection electrode CE1 also contacts the back metal layer BML. For example, the first connection electrode CE1 may contact the back metal layer BML through a contact hole penetrating the second insulating layer IL2, the first insulating layer IL1, and the buffer layer BFR. In this case, the first connection electrode CE1, the second connection electrode CE2, and the back metal layer BML may be electrically connected based on the signal applied to the gate electrode GAT.

In some embodiments, each of the first connection electrode CE1 and the second connection electrode CE2 includes a metal, an alloy, a conductive metal oxide, a transparent conductive material, and/or the like. Examples of materials that can be used as the first connection electrode CE1 and the second connection electrode CE2 may include silver (Ag), an alloy containing silver, molybdenum (Mo), an alloy containing molybdenum, aluminum (Al), Alloys containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium-tin oxide (ITO), indium-zinc oxide (IZO), or the like. These may be used alone or in combination with each other.

The third insulating layer IL3 may be disposed on the second insulating layer IL2 and may cover the first connection electrode CE1 and the second connection electrode CE2. The third insulating layer IL3 may include an organic insulating material. Examples of organic insulating materials that can be used as the third insulating layer IL3 may include photoresist, polyacryl-based resin, polyimide-based resin, and polyamide-based resin, siloxane-based resin, acrylic-based resin, epoxy-based resin, or the like. These may be used alone or in combination with each other. In some embodiments, the third insulating layer IL3 is disposed in the display area DA on the second insulating layer IL2.

In some embodiments, a fourth insulating layer may be additionally disposed between the second insulating layer IL2 and the third insulating layer IL3. In this case, the fourth insulating layer may be disposed on the second insulating layer IL2 to cover the first connecting electrode CE1 and the second connecting electrode CE2, and the third insulating layer IL3 may be disposed on the fourth insulating layer.

In some embodiments, the fourth insulating layer includes an inorganic material. Examples of inorganic materials that can be used as the fourth insulating layer may include silicon oxide, silicon nitride, or silicon oxynitride. These may be used alone or in combination with each other.

The anode electrode ADE may be disposed on the third insulating layer IL3. The anode electrode ADE may include a conductive material. The anode electrode ADE may be connected to the first connection electrode CE1 through a contact hole formed in the third insulating layer IL3. Accordingly, the anode electrode ADE may be electrically connected to the transistor TR.

The pixel defining layer PDL may be disposed on the anode electrode ADE. The pixel defining layer PDL may cover a peripheral portion of the anode electrode ADE and may define a pixel opening exposing a central portion of the anode electrode ADE. The pixel defining layer PDL may include an organic insulating material. In some embodiments, the pixel defining layer PDL is disposed in the display area DA on the third insulating layer IL3.

The emission layer EL may be disposed on the anode electrode ADE. In some embodiments, the emission layer EL is disposed on the anode electrode ADE exposed by the pixel opening. However, the present disclosure is not necessarily limited thereto, and in other embodiments, the emission layer EL may be disposed on the anode electrode ADE and the pixel defining layer PDL.

The cathode electrode CTE may be disposed on the emission layer EL and the pixel defining layer PDL. The emission layer EL may emit light based on a voltage difference between the anode electrode ADE and the cathode electrode CTE.

FIGS. 5 to 11 are views illustrating display devices according to other embodiments. For example, FIGS. 5 to 8 may correspond to the enlarged view of FIG. 3, and FIGS. 9 and 11 may correspond to the cross-sectional view of FIG. 4.

Hereinafter, display devices according to various embodiments will be described with reference to FIGS. 5 to 11. In the following description, differences from the display device described with reference to FIGS. 1 to 4 will be mainly described, and repeated descriptions will be omitted or simplified.

Referring to FIGS. 5 and 6, in some embodiments, at least one of the auxiliary patterns AP has a bar shape (e.g., an elongated rectangular shape) extending in the first direction D1 in a plan view.

For example, as shown in FIG. 5, in a plan view, at least one of the auxiliary patterns AP may extend in the first direction D1 and have a bar shape parallel to the transfer lines FL. Also, as shown in FIG. 6, in a plan view, at least one of the auxiliary patterns AP may generally extend in the first direction D1 and have an elongated shape with at least one broken or discontinuous portion and/or a at least one bent portion. For example, in a plan view, the auxiliary patterns AP may have a zig-zag shape extending in part in the first direction D1 and in part in the second direction D2.

Referring to FIG. 7, in some embodiments, the auxiliary patterns AP defining at least one of the auxiliary marks AM are disposed in the two spaced spaces SS sequentially arranged in the second direction D2. For example, as shown in FIG. 7, each of the auxiliary marks AM having a number shape such as '0', '1', '2', '3', '4', and '5' may be defined by grouping the auxiliary patterns AP disposed in the two spaced spaces SS sequentially arranged in the second direction D2. According to some embodiments, a degree of integration of the auxiliary patterns AP is further improved (e.g., increased). Thus, a dead space of the display device 10 may be further reduced.

Referring to FIG. 8, in some embodiments, the auxiliary marks AM are arranged along the first direction D1 as well as the second direction D2. In other words, the auxiliary marks AM may be arranged in the first direction D1 and the second direction D2. In this case, the auxiliary mark sets AMS may also be arranged in the first direction D1 and the second direction D2.

In addition, in other embodiments, when the auxiliary marks AM are arranged along the first direction D1 as well as the second direction D2, the auxiliary marks AM sequentially arranged in the first direction D1 may be grouped to define the auxiliary mark sets AMS.

Referring to FIG. 9, in some embodiments, the auxiliary pattern AP are disposed in the peripheral area PA on the first insulating layer IL1. In other words, the auxiliary pattern AP may be formed together with the gate electrode GAT. In other words, the auxiliary pattern AP may include the same material as the gate electrode GAT. For example, the auxiliary pattern AP may include a metal, an alloy, a conductive metal nitride, a conductive metal oxide, a transparent conductive material, and/or the like.

Referring to FIG. 10, in some embodiments, the auxiliary pattern AP is disposed in the peripheral area PA on the second insulating layer IL2. In other words, the auxiliary pattern AP may be formed together with the first connection electrode CE1 and the second connection electrode CE2. The auxiliary pattern AP may include the same material as the first connection electrode CE1 and the second connection electrode CE2. For example, the auxiliary pattern AP may include a metal, an alloy, a conductive metal nitride, a conductive metal oxide, a transparent conductive material, or the like.

Referring to FIG. 11, in some embodiments, the auxiliary pattern AP is disposed in the peripheral area PA on the substrate SUB. In other words, the auxiliary pattern AP may be formed together with the back metal layer BML. In other words, the auxiliary pattern AP may include the same material as the back metal layer BML. For example, the auxiliary pattern AP may include a metal, an alloy, a conductive metal nitride, a conductive metal oxide, a transparent conductive material, and/or the like.

The display device according to some embodiments includes the auxiliary patterns AP disposed in at least one of the spaced spaces SS defined between the transfer lines FL. Also, the auxiliary marks AM may be defined by grouping at least two or more of the auxiliary patterns AP to provide various pieces of information related to the transfer lines FL. Accordingly, since the auxiliary marks AM can be defined by grouping the auxiliary patterns AP even when the distance between the transfer lines FL is small, the auxiliary marks AM may be easily formed. Thus, an efficiency of the manufacturing process of the display device may be improved (e.g., increased). In addition, a dead space of the display device generated in a process of forming the auxiliary marks AM may be reduced. Accordingly, a display quality of the display device may be improved (e.g., increased).

The present disclosure should not be construed as being limited to the embodiments set forth herein. Rather, these embodiments are provided so that this disclosure will be thorough and complete and will fully convey the concept of the present disclosure to those skilled in the art.

While the present disclosure has been particularly shown and described with reference to embodiments thereof, it will be understood by those of ordinary skill in the art that various changes in form and details may be made therein without departing from the spirit or scope of the present disclosure as defined by the following claims and equivalents thereof.

What is claimed is:

1. A display device comprising:
   a substrate;
   a plurality of pixels positioned in a display area on the substrate;
   a plurality of transfer lines configured to transfer signals or voltages to the pixels, the plurality of transfer lines extending in a first direction and being spaced apart from each other in a second direction perpendicular to the first direction; and
   a plurality of auxiliary patterns in at least one of a plurality of gap spaces defined between ones of the transfer lines adjacent to each other in the second direction,
   wherein a group of at least two auxiliary patterns of the plurality of auxiliary patterns defines an auxiliary mark on the substrate.

2. The display device of claim 1, wherein the group of at least two auxiliary patterns defining the auxiliary mark is positioned in three of the gap spaces sequentially arranged in the second direction.

3. The display device of claim 1, wherein the group of at least two auxiliary patterns defining the auxiliary mark is positioned in two of the gap spaces sequentially arranged in the second direction.

4. The display device of claim 1, wherein a planar shape of the auxiliary mark is a number shape, a character shape, or a symbol shape.

5. The display device of claim 1, wherein at least one of the auxiliary patterns has a dot shape in a plan view.

6. The display device of claim 1, wherein at least one of the auxiliary patterns extends in the first direction and has a bar shape parallel to the transfer lines.

7. The display device of claim 1, wherein at least one of the auxiliary patterns extends in the first direction and has a bar shape with at least one bent or discontinuous portion.

8. The display device of claim 1, further comprising:

an active pattern positioned in the display area on the substrate;

a gate electrode on the active pattern; and a first connection electrode and a second connection electrode on the gate electrode, wherein each of the auxiliary patterns comprises a same material as the active pattern.

9. The display device of claim 1, further comprising:

an active pattern positioned in the display area on the substrate;

a gate electrode on the active pattern; and a first connection electrode and a second connection electrode on the gate electrode, wherein each of the auxiliary patterns comprises a same material as the gate electrode.

10. The display device of claim 1, further comprising:

an active pattern positioned in the display area on the substrate;

a gate electrode on the active pattern; and a first connection electrode and a second connection electrode on the gate electrode, wherein each of the auxiliary patterns comprises a same material as the first connection electrode and the second connection electrode.

11. The display device of claim 1, wherein a plurality of auxiliary marks comprising the auxiliary mark is arranged along the second direction in a plan view.

12. The display device of claim 11, wherein at least one gap space of the gap spaces is located between ones of the auxiliary marks adjacent to each other in the second direction.

13. The display device of claim 11, wherein the plurality of auxiliary marks define, on the substrate, a plurality of auxiliary mark sets in which two or more auxiliary marks that are sequentially arranged in the second direction are grouped.

14. The display device of claim 13, wherein the auxiliary mark sets are arranged along the second direction in a plan view.

15. The display device of claim 14, wherein at least one gap space of the gap spaces is located between ones of the auxiliary mark sets adjacent to each other in the second direction.

16. The display device of claim 13, wherein the auxiliary marks are arranged along the first direction and the second direction in a plan view.

17. The display device of claim 16, wherein the auxiliary marks sets are arranged along the first direction and the second direction in a plan view.

18. The display device of claim 1, wherein the auxiliary patterns are spaced apart from the transfer lines in a plan view.

19. The display device of claim 18, wherein a width of each of the gap spaces in the second direction is 7.5 μm or less.

20. The display device of claim 19, wherein a width of each of the auxiliary patterns in the second direction is 3.5 μm or less.

* * * * *